(12) United States Patent
Dally et al.

(10) Patent No.: US 7,257,183 B2
(45) Date of Patent: Aug. 14, 2007

(54) DIGITAL CLOCK RECOVERY CIRCUIT

(75) Inventors: William J. Dally, Stanford, CA (US); John H. Edmondson, Arlington, MA (US); Ramin Farjad-Rad, Mountain View, CA (US)

(73) Assignee: Rambus Inc., Los Altos, CA (US)

( * ) Notice: Subject to any disclaimer, the term of this patent is extended or adjusted under 35 U.S.C. 154(b) by 914 days.

(21) Appl. No.: 10/178,902

(22) Filed: Jun. 21, 2002

(65) Prior Publication Data

US 2003/0086339 A1 May 8, 2003

Related U.S. Application Data

(60) Provisional application No. 60/304,251, filed on Jul. 10, 2001.

(51) Int. Cl.
*H03D 3/24* (2006.01)
*H03D 3/18* (2006.01)

(52) U.S. Cl. ............... 375/376; 375/374; 375/375; 375/327; 331/DIG. 2; 331/1 A

(58) Field of Classification Search ............... 375/376, 375/328, 371, 327, 360, 293, 294, 375, 377; 331/DIG. 2, 25, 1 A; 328/151, 63; 348/708, 348/571
See application file for complete search history.

(56) References Cited

U.S. PATENT DOCUMENTS

| | | | | | |
|---|---|---|---|---|---|
| 4,280,224 A | * | 7/1981 | Chethik | .................. | 375/368 |
| 4,445,224 A | * | 4/1984 | Ihira et al. | .................. | 375/376 |
| 4,766,397 A | * | 8/1988 | Adams | .................. | 331/1 A |
| 4,926,447 A | * | 5/1990 | Corsetto et al. | .................. | 375/376 |
| 4,933,959 A | * | 6/1990 | Knechtel | .................. | 375/376 |
| 5,917,873 A | * | 6/1999 | Shiomoto et al. | .................. | 375/376 |
| 6,128,680 A | * | 10/2000 | Sallee | .................. | 710/66 |
| 6,768,385 B2 | * | 7/2004 | Smith | .................. | 331/1 A |

OTHER PUBLICATIONS

Lee, Thomas H., et al., "A 155-MHZ Clock Recovery Delay—and Phase-Locked Loop," pp. 421-430, Reprinted from *IEEE Journal of Solid-State Circuits*, vol. SC-27, pp. 1736-1746 (Dec. 1992).

Soyuer, Mehmet, "A Monolothic 2.3-Gb/s 100-mW Clock and Data Recovery Circuit in Silicon Bipolar Technology," pp. 450-453, Reprinted from *IEEE Journal of Solid-State Circuits*, vol. SC-28, pp. 1310-1313 (Dec. 1993).

(Continued)

*Primary Examiner*—Mohammed Ghayour
*Assistant Examiner*—Qutub Ghulamali
(74) *Attorney, Agent, or Firm*—Hamilton, Brook, Smith & Reynolds, P.C.

(57) ABSTRACT

A clock recovery circuit includes a sampler for sampling a data signal. Logic determines whether a data edge lags or precedes a clock edge which drives the sampler, and provides early and late indications. A filter filters the early and late indications, and a phase controller adjusts the phase of the clock based on the filtered indications. Based on the filtered indications, a frequency estimator estimates the frequency difference between the data and clock, providing an input to the phase controller to further adjust the phase so as to continually correct for the frequency difference.

26 Claims, 11 Drawing Sheets

OTHER PUBLICATIONS

Savoj, Jafar, et al., "A 10-Gb/s CMOS Clock and Data Recovery Circuit," *IEEE*, pp. 136-139 (2000).

Poulton, John, et al., "A Tracking Clock Recovery Receiver for 4Gb/s Signaling," pp. 157-169.

Hu, Timothy H., et al., "A Monolithic 480 Mb/s Parallel AGC/Decision/Clock-Recovery Circuit in 1.2-μm CMOS," pp. 437-443, Reprinted from *IEEE Journal of Solid-State Circuits*, vol. SC-28, pp. 1314-1320 (Dec. 1993).

Ishihara, Noboru, et al., "A Monolithic 156 Mb/s Clock and Data Recovery PLL Circuit Using the Sample-and-Hold Technique," pp. 431-436, Reprinted from *IEEE Journal of Solid-State Circuits*, vol. SC-29, pp. 1566-1571 (Dec. 1994).

Farjad-Rad, Ramin, et al., "A 0.3-μm CMOS 8-Gb/s 4-PAM Serial Link Transceiver," *IEEE Journal of Solid-State Circuits*, 35(5): 757-764 (May 2000).

Fiedler, Alan, et al., "A 1.0625Gbps Transceiver with 2x-Oversampling and Transmit Signal Pre-Emphasis," *IEEE*: 462-464 (1997).

Thon, L., "540Mhz 21 mW MDFE Equalizer and Detector in 0.25 μm CMOS," *IEEE International Solid-State Circuits Conference*, (Feb. 1998).

Dally, William J., et al., "Transmitter Equalization for 4Gb/s Signaling," pp. 29-38.

Banu, B., and Dunlop, A., "TA 6.4: A 660Mb/s CMOS Clock Recvoery Circuit with Instantaneous Locking for NRZ Data and Burst-Mode Transmission," *IEEE International Solid-State Circuits Conference* (1993).

Lai, B., and Walker, R.C., "A Monolithic 622Mb/s Clock Extraction Data Retiming Circuit," *IEEE International Solid-State Circuits Conference* (1991).

Beomsup, K., et al., "A 30-MHz Hybrid Analog/Digital Clock Recovery Circuit in 2-μm CMOS," *IEEE Journal of Solid-State Circuits*, 25(6) (Dec. 1990).

* cited by examiner

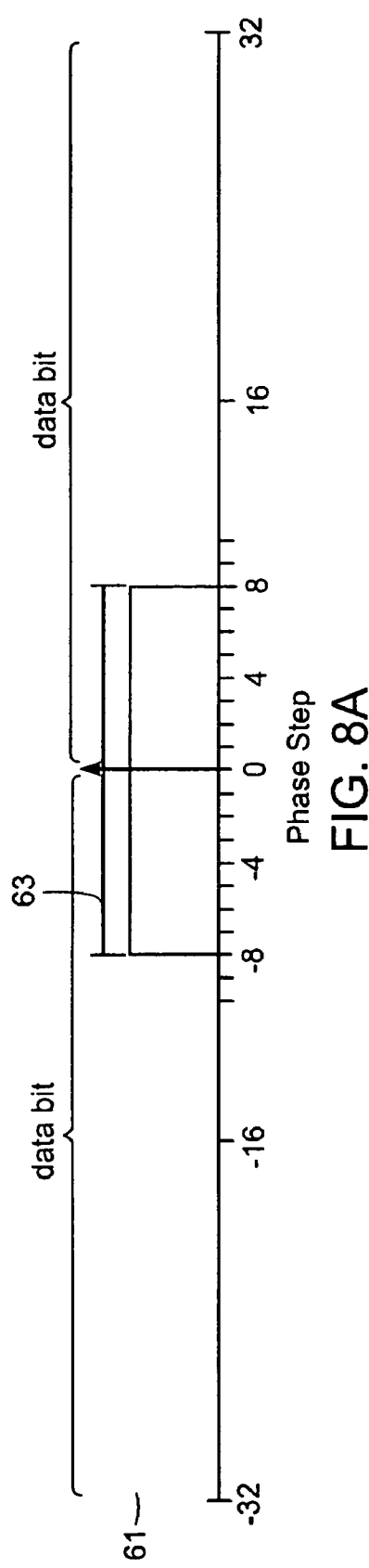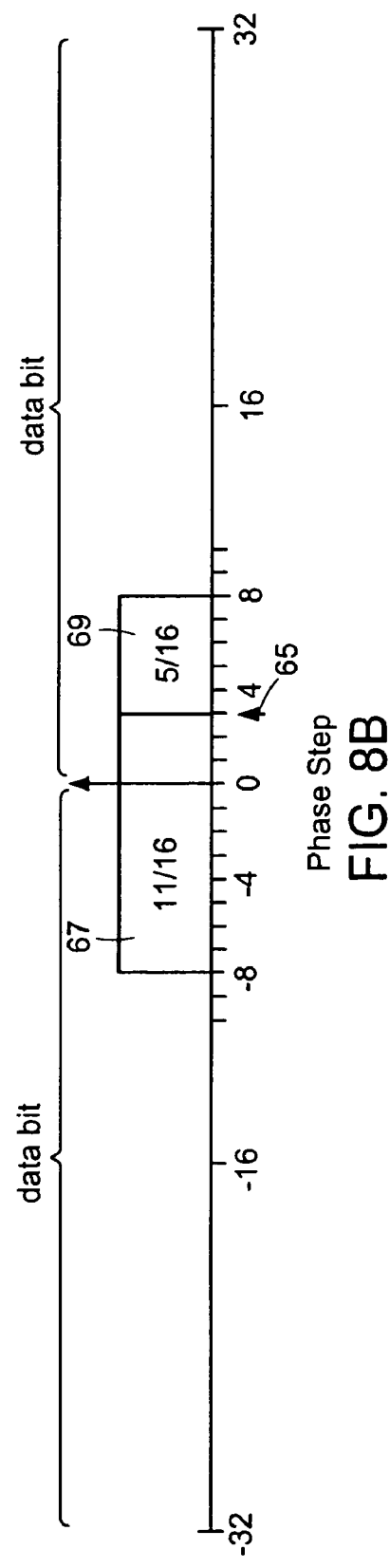

DIGITAL CLOCK RECOVERY CIRCUIT

RELATED APPLICATION

This application claims the benefit of U.S. Provisional Application No. 60/304,251, filed on Jul. 10, 2001. The entire teachings of the above application are incorporated herein by reference.

BACKGROUND OF THE INVENTION

FIG. 1 is a timing chart 2 illustrating a typical high-speed data signal in which the clock signal is intrinsic to the data signal. Here, five data bits are shown, representing the sequential binary sequence {10010}.

In at least one currently employed clock recovery circuit, a data signal is oversampled by a factor of two to recover the "edge" between two data bits and adjust the phase of the recovered clock based on this edge measurement.

For example, FIG. 2 shows the same timing chart 2 as FIG. 1, and further illustrates the ideal data sample points 4 and edge sample points 5 used by a factor-of-two oversampling clock recovery circuit.

FIGS. 3A and 3B illustrate how an edge between two data bits is recovered. In FIG. 3A, the two data samples 8,10 have different values, so it is clear that an edge occurred between them. Here, because the edge sample 9 has the same value as the first data sample 8, it is deduced that the sample 9 was early, i.e. the sample occurred prior to the actual edge between the two bits. With the knowledge that the edge was sampled early, the sampling clock can be adjusted by adding a small delay.

In FIG. 3B, again the two data samples 8, 10 have different values, so again it is clear that an edge occurred between them. Now, because the edge sample 9 has the same value as the second data sample 10, it is deduced that the sample 9 was late, i.e. the sample occurred after the actual edge between the two bits. With the knowledge that the edge was sampled late, the sampling clock can be advanced.

Of course, where the value does not change between two consecutive data bits, as with the two consecutive 0s in FIG. 1, no edge exists to aid in clock recovery.

FIG. 4 is a block diagram of a clock recovery loop 20. This loop 20 is basically a two stage counter that accumulates the net difference between early and late edges detected by a set of samplers 22, four for example. For each bclk cycle, the samplers 22 acquire four equally spaced values from the line, i.e. two data bit samples and the edges immediately following these bits, clocked by a four-phase clock from a phase interpolator 24.

The early/late logic 26 examines these four samples, along with the previous (historical) data bit, and determines whether one or more edges occurred and whether the sample points are unambiguously early or late with respect to the data signal edges. (Early and late here refers to early and late samples. This is exactly the opposite of an early or late edge. That is, an early sample corresponds to a late edge.)

The early/late logic 26 provides early and late indications accordingly. These indications become inputs to the two-stage counter 28, 29. The first stage 28 of the counter divides by N, four for example, to filter the number of noisy edge samples, i.e., the number of early/late indications. The second stage 29 of the counter has 2P counts, corresponding to P phase steps per bit cell over the two bit cells spanned by the half-bit-rate bclk. In this figure, there are P=32 phase steps per bit cell and thus the counter has 2P=64 states encoded as a 6-bit phase setting.

Thus, overall, the two-stage counter 28, 29 forms a divide by 2×P×N counter that accumulates the net difference between the number of early and late samples. The divide-by-N counter 28 acts to filter the early and late signals, reducing the variance due to jitter on the input signal. The divide-by-2P phase counter 29 accumulates the net early and late signals out of the divide-by-N counter to generate a $\log_2(2P)=6$ bit phase setting signal.

The phase interpolator 24 accepts a reference clock, bclk, and the phase setting output 25 from the divide by 2P counter 29. The phase interpolator 24 generates a sample clock 27 for each of the four samplers 22. The sample clock for the first sampler is displaced from the reference clock by an amount determined by the phase setting from the divide by 2P counter. The relative phase from the reference clock to the first sampler clock is 360×p/64 degrees, where p is the phase setting output 25 from the counter 29. For example, if p=0, the two clocks are exactly aligned; and if p=16, the first sample clock is displaced by 90 degrees from the reference clock. The four sample clocks are spaced evenly around the unit circle—each following the previous clock by 90 degrees.

FIG. 5 is a timing chart illustrating operation of the phase interpolator 24 of FIG. 4. The reference clock (blck) pulse is shown at 60, while 61 and 62 each illustrates the four outputs of the phase interpolator 24 where p=0 and p=8, respectively.

SUMMARY OF THE INVENTION

When the input data signal has considerable jitter, this edge sample is very noisy. The edge may be seen as early (late) even if the sample point is correctly placed or late (early), and corrections to the sample clock can result in "phase wander". This phase wander of the sample clock can be minimized by filtering pulses, using, for example, a divide-by-N counter where N is a reasonably large number.

On the other hand, when the data clock frequency and the sample clock frequency are not exactly the same, "phase lag" can occur. Filtering as above for phase wander can increase the effect of phase lag.

Thus, there is a tension between phase wander and phase lag. Choosing a large N makes phase wander small but phase lag large. Similarly a small N reduces phase lag at the expense of wander. With large amounts of input jitter and a large $\Delta f$, it is not possible to get the recovery clock circuit of FIG. 4 to meet both constraints.

The present invention is a second-order, dual-loop clock-data recovery (CDR) circuit that overcomes this problem by adding a digital frequency estimator loop to estimate the difference between input and reference clock frequencies, and then removing this difference. The divider then must only deal with deviations from the estimated frequency. This permits a very large divider to be used without compromising the ability to track over a wide input frequency range.

According to an embodiment of the present invention, a clock recovery circuit includes a sampler for sampling a data signal. Logic determines whether a data edge lags or precedes a clock edge which drives the sampler, and provides early and late indications. A filter filters the early and late indications, and a phase controller adjusts the phase of the clock based on the filtered indications. Based on the filtered indications, a frequency estimator estimates the frequency difference between the data and clock, providing an input to the phase controller to further adjust the phase so as to continually correct for the frequency difference.

A phase interpolator adjusts the phase of the clock responsive to the phase controller.

The frequency estimator may include a second filter, a frequency counter, and a frequency synthesizer. The second filter further filters the filtered indications. The frequency counter, responsive to the further filtered indications, produces an output that represents an estimated difference in frequency between the clock and the data. The frequency synthesizer produces signals responsive to the estimated frequency difference. The signals control the phase controller to further adjust the phase.

The frequency synthesizer may include a divide-by-X counter which divides the clock by a number X, which is based on the estimated frequency difference. The divided clock then provides the input to the phase controller to further adjust the phase.

A converter may convert the estimated frequency difference to a corresponding period, where the number X is responsive to the period. The divide-by-X counter may include both a divide-by-K counter, where K is a fixed number, as well as a divide-by-V counter, where V is responsive to the period. A single divide-by-K counter may be used by plural clock recovery circuits.

In one embodiment, the converter uses a conversion table that may be stored, for example, in a read-only-memory (ROM). Alternatively, the converter may perform a 1's complement of a magnitude portion of the estimated frequency difference. The converter may also be implemented with a microprocessor, which may also implement at least a portion of the divide-by-X counter.

In one embodiment, the frequency counter may be a saturating counter.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 8A is a graph a illustrating a probability density function for the position of an edge between two bit cells when the input data signal has considerable jitter.

FIG. 8B is a the same graph of FIG. 8A, additionally showing the case where a sample is taken at phase step +3.

DETAILED DESCRIPTION OF THE INVENTION

A description of preferred embodiments of the invention follows.

Phase Wander

Figure 1:
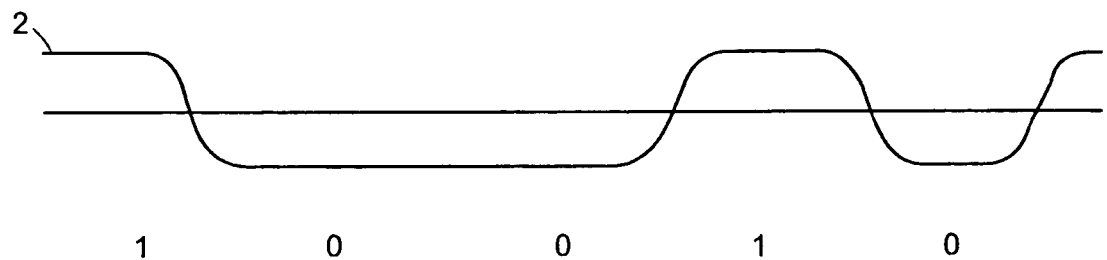
FIG. 1 is a timing chart illustrating a typical high-speed data signal in which the clock signal is intrinsic to the data signal.
Figure 2:
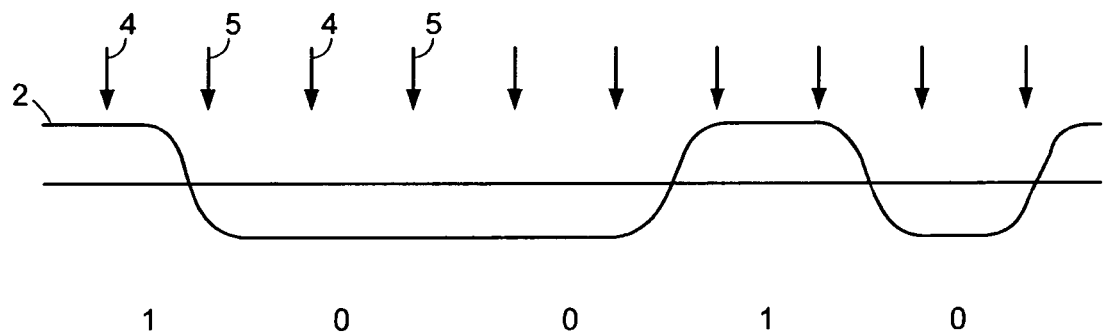
FIG. 2 is the timing chart of FIG. 1, further illustrating the ideal data and edge sample points used by a factor-of-two oversampling clock recovery circuit.
Figure 6:
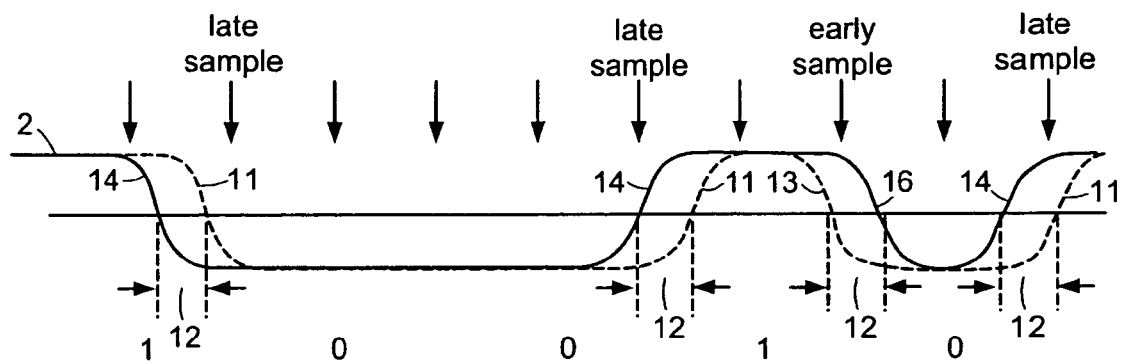
FIG. 6 is the timing chart of FIG. 2, in which jitter has been added to the signal.
Figure 3A:
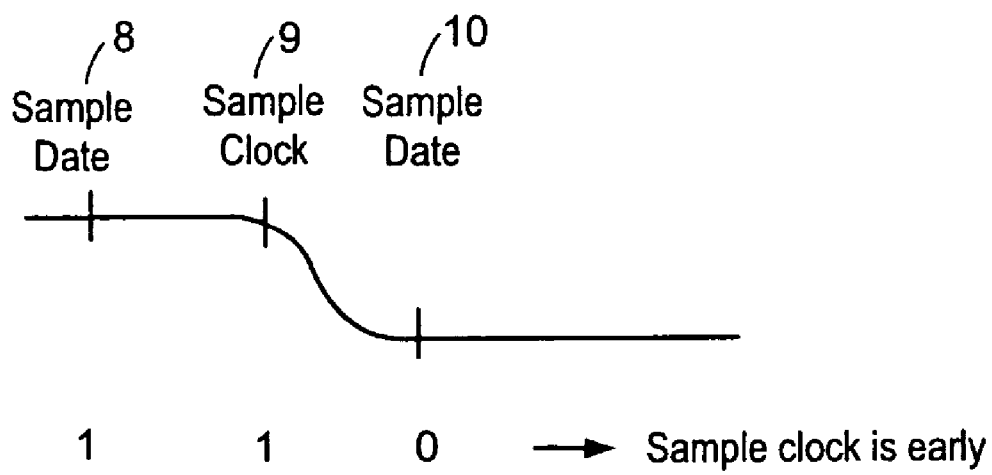
FIGS. 3A and 3B are timing charts that illustrate how an edge between two data bits is recovered.
Figure 3B:
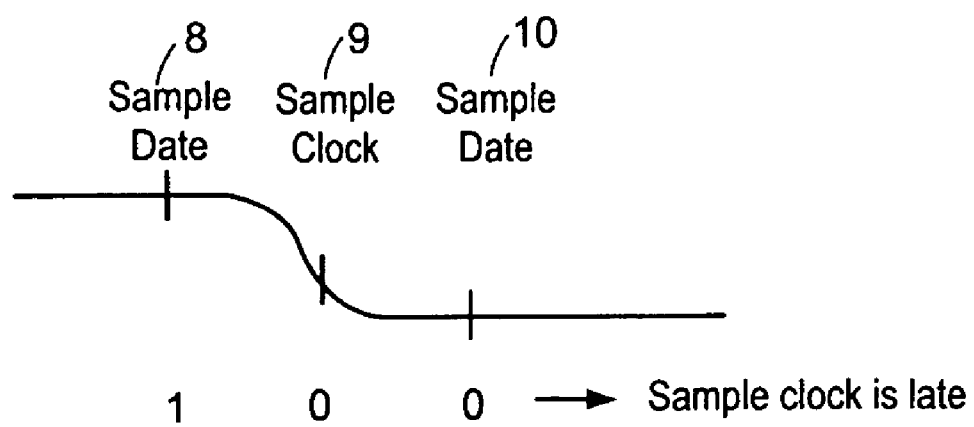

FIG. 6 is the timing chart 2 of FIG. 1, but with jitter 12 added to the signal. That is, the edges do not occur exactly at equal intervals but rather each edge is displaced according to some probability distribution.

For example, the edges 14 in FIG. 6 occur early (but by different amounts), while the edge 16 occurs late. The dashed lines represent how the signal should appear with no jitter.

Because the recovery circuit's clock phase is adjusted based on this noisy measurement, the clock phase will wander about the correct setting. That is, it takes a somewhat random walk about its center point. Each time an early edge, such as 14, is sampled, the clock is advanced. Each time a late edge, such as 16, is sampled, the clock is retarded. Thus the random distribution of edge times—due to jitter on the input signal—leads to random movement of the clock sampling point.

This movement is not completely random. If the clock is displaced from its correct position (for example if it is early) it will be adjusted in the correct direction (being retarded) more often that it will be adjusted in the incorrect direction (being advanced). However, the clock position may take many steps in the wrong direction, leading to a broad probability distribution in the position of the clock sample point.

Reducing this "phase wander" to acceptable levels requires considerable filtering of the raw edge samples. By integrating over many samples before adjusting the clock, the variance of the clock adjustments is reduced and the probability distribution of the clock sample position is narrowed.

A Markov analysis of a system with N=4 having jitter uniformly distributed over 0.5 unit interval (UI) shows that such a system may have over 0.44 UI of phase wander.

When the input data signal has considerable jitter, the position of the edge between two bit cells is a random variable. FIG. 8A shows the probability density function for this variable when the input jitter is uniformly distributed over a range of 0.5 UI. The x-axis is shown in phase steps for a system where 32 (i.e., P) phase steps are spaced uniformly over a single UI. The distribution of jitter ranges from −8 steps (−0.25 UI) to +8 steps (+0.25 UI).

With the data edge position being a random variable, whether an edge sample is early or late (as indicated by the early/late indication) is also a random variable. For example, the probability that a sample taken at phase step +i is early is (8−i)/16 and the probability of the sample being late is (8+i)/16. FIG. 8B shows the case where a sample is taken at phase step +3, as denoted by arrow 65. At this point, 5/16 of the area of the density function falls to the right of the sample point and 11/16 falls to the left. Hence the probability that the sample is late is 11/16, while the probability that the sample is early is 5/16.

To model phase wander, assume that there is no net difference between the input data frequency and twice the reference clock (bclk) frequency and calculate the probability P(x) of the counter wandering x phase steps from the center position.

Figure 9:
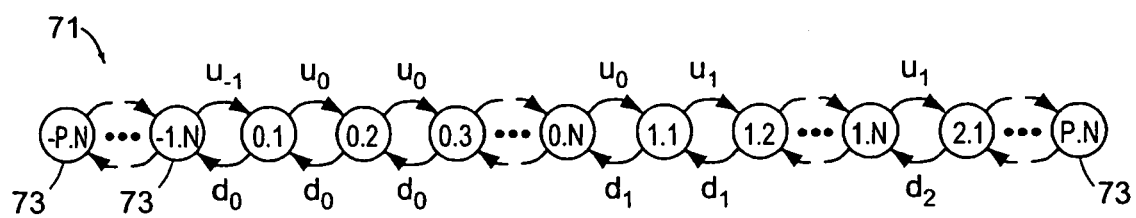
FIG. 9 is an illustration of a Markov chain which is used to perform analysis of phase wander.

FIG. 9 is an illustration of a Markov chain 71 which can be used to perform the analysis of phase wander. Each node 73 in the chain 71 represents a state of the two-stage counter 28, 29. The label A.B represents the state where the phase counter 29 has a count of A (within a range of 0 to 2P−1, or alternatively −P to +P) and the divide by N counter 28 has a count of B. The probability of an early or late sample edge gives the transition probability between two states. Thus, the transition probabilities out of the state A.B are determined entirely by the label A, with the down probability $d_A$ given by the integral of the probability density function up to phase step A and the up probability $u_A$ given by the remaining area under the curve:

$$u_A = \int_{x=\frac{P}{2}}^{A} P(x)dx$$

$$d_A = 1 - u_A$$

Since the Markov chain 71 of FIG. 9 is a linear chain (also called a birth-death system), we can analyze it in closed form since in steady state we know:

$$P(A.B) = P(A.B-1)\frac{u_{A.B-1}}{d_{A.B}}$$

where A.B−1 denotes decrementing the two-stage counter state. Since the up and down probabilities for the N states at each phase setting are the same, one can write:

$$P(A.N) = P(A.1)\left(\frac{u_A}{d_A}\right)^{N-1}$$

$$P((A+1).1) = P(A.N)\left(\frac{u_A}{d_{A+1}}\right)$$

Figure 10:
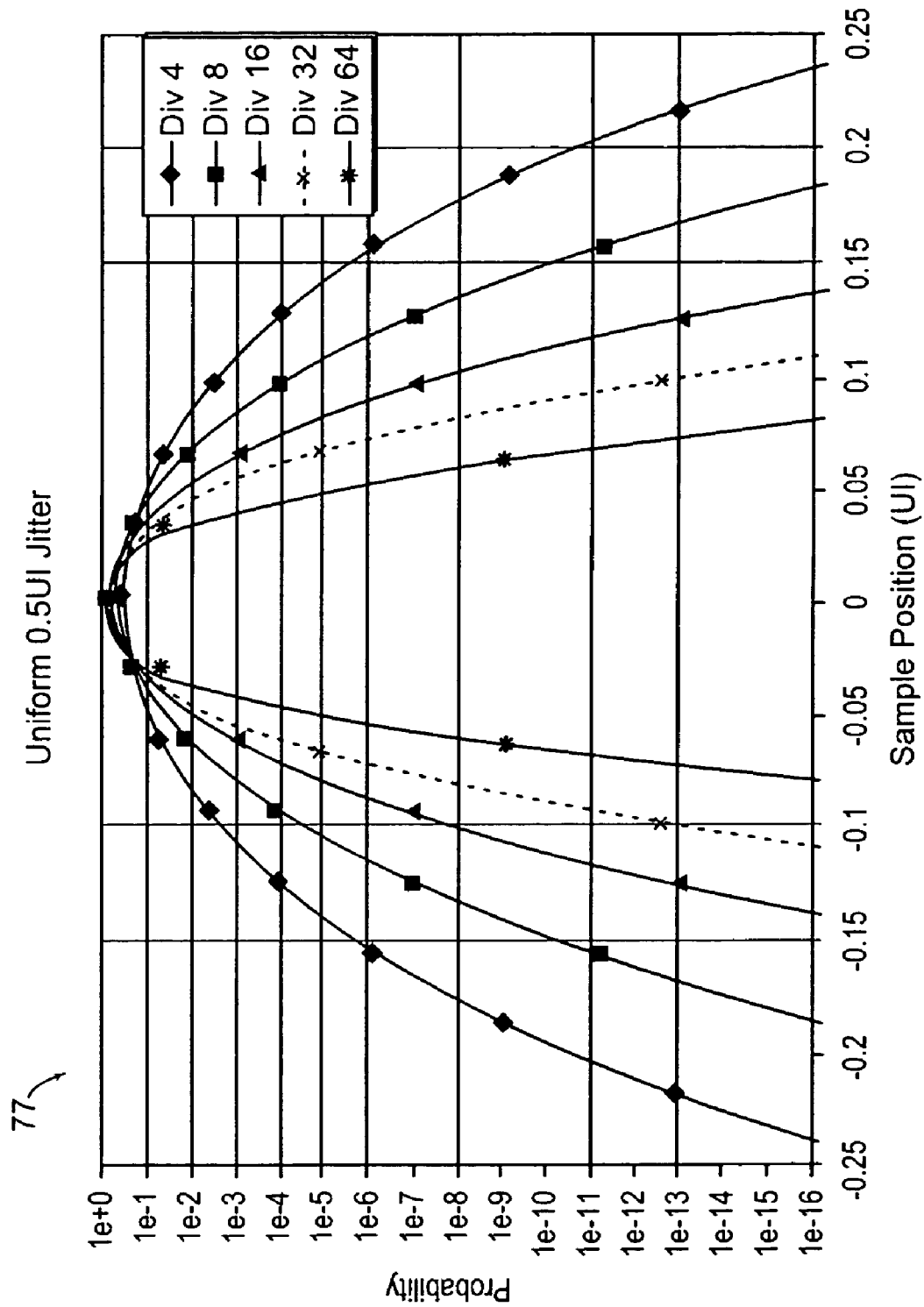
FIG. 10 is a chart showing state probabilities of the two stage counter of FIG. 4 for an arbitrary jitter probability density function.

Using these equations, we can solve for the state probabilities of the two stage counter for an arbitrary jitter probability density function. FIG. 10 is a chart 77 which shows these probabilities for a 32-step-per-UI phase counter, i.e. P=32, and filter counters ranging from N=4 to N=64. The chart 77 shows that with 0.5 UI uniform jitter, the phase wander range that has a probability of at least $10^{-15}$ of occurring is from −0.23 UI to +0.23 UI, i.e., an eye opening of almost 0.5 UI for N=4. For N=64, this is reduced to a range of −0.075 UI to +0.075 UI, an eye opening of only 0.15 UI.

Thus, to maintain a bit error rate (BER) better than $10^{-15}$, a sufficient eye opening, e.g., 0.5 UI for N=4, 0.15 UI for N=64, etc., must be allowed to account for phase wander. That is, the smaller N is, the larger the eye opening must be to achieve the same BER.

Phase Lag

Figure 7:
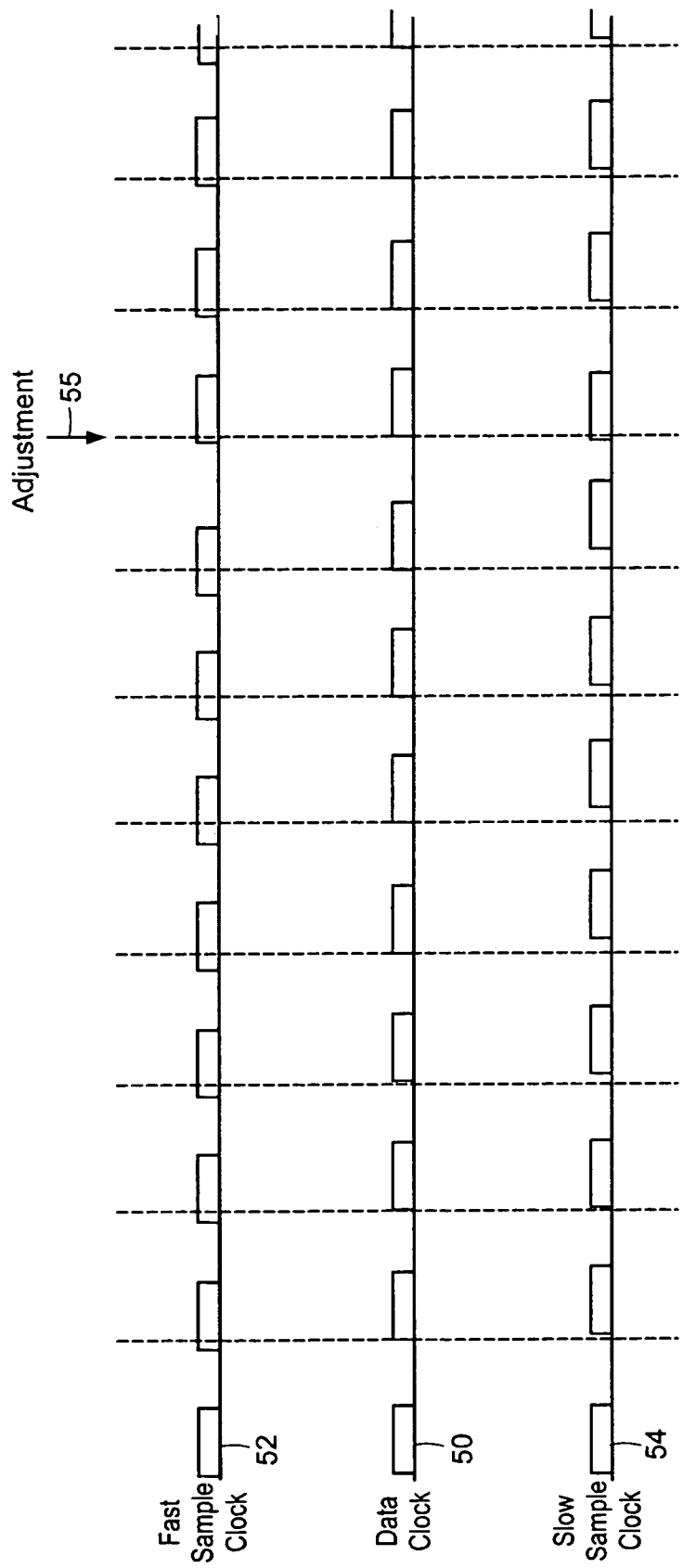
FIG. 7 is a timing chart illustrating, in a greatly exaggerated manner, the respective cases of a sample clock running faster and slower than a data clock.

Another phenomenon is "phase lag". As FIG. 7 illustrates, in a greatly exaggerated manner, when the sample clock 52 is faster than the data clock 50, it leads the data clock 50, on average, over time. Eventually, the sample clock is adjusted (at 55) so that the two clocks are almost exactly synchronized. However, due to the difference in frequency, the sample clock 52 soon leads the data clock 50 more than it lags. A similar effect occurs when the sample clock is slower than the data clock 54, as illustrated at 54.

Thus, when the input data frequency (illustrated as 50) is slightly faster (slower) than the reference clock frequency (plesiochronous) and the input signal has significant jitter, the sample point will lag (lead) the correct value so that the early/late probabilities are unbalanced by an amount large enough to generate sufficient net early (late) edges to adjust the clock position often enough to keep up with the constant phase drift between the two clocks. However, when a large filter is employed, for example to reduce phase wander, phase lag is increased as the number of early (late) edges required for each clock adjustment is increased.

Figure 4:
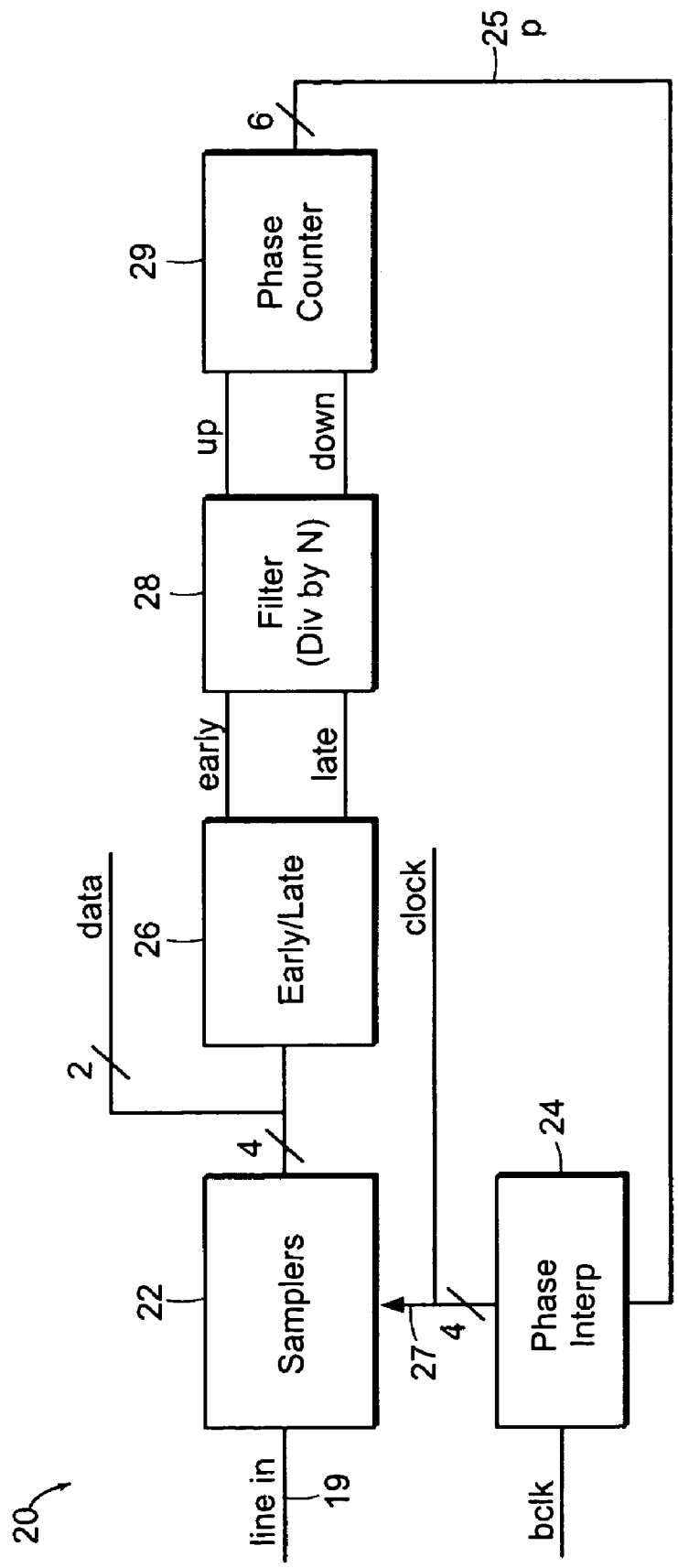
FIG. 4 is a schematic diagram of a clock recovery circuit.
Figure 5:
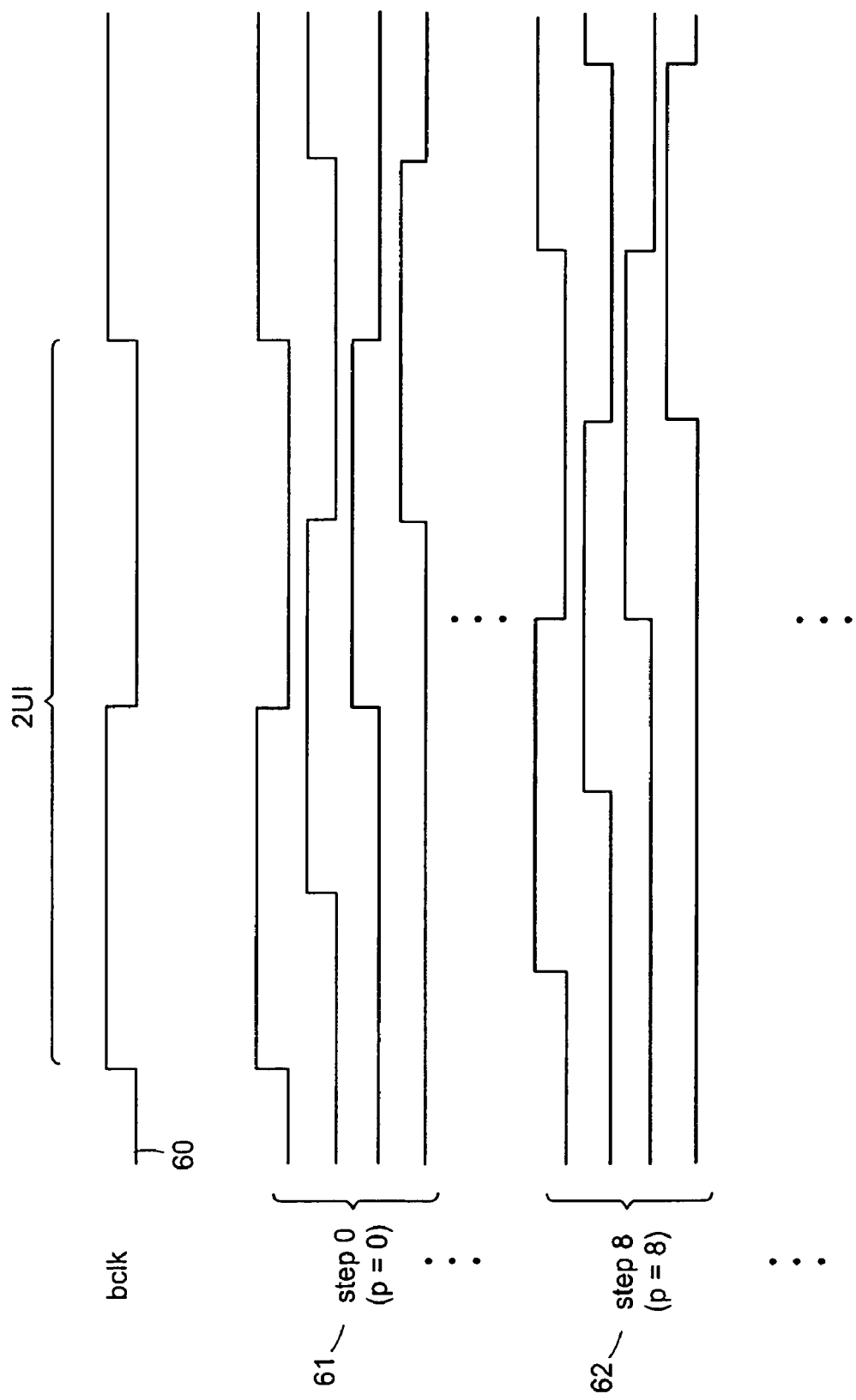
FIG. 5 is a timing chart illustrating operation of the phase interpolator of the clock recovery circuit of FIG. 4.

Referring back to the clock recovery loop of FIG. 4, the fraction of edges that drive the two-stage phase counter 28, 29 in the proper direction is directly proportional to the offset of the data sample point from the center of the eye—and hence the offset of the edge sample point from the edge of the eye.

Figure 11:
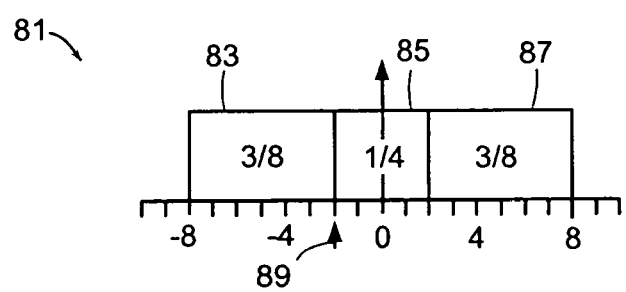
FIG. 11 is a probability density function used to illustrate phase lag.

To see this, consider the situation illustrated in FIG. 11. Here we have 0.5 UI of uniform jitter and 32 phase steps per UI. The sample clock phase is currently early relative to the input data signal, leading the input signal by two phase steps (0.0625 UI). This offset of two steps, along with a complementary offset of two steps in the opposite direction together consume four phase steps (0.125) of the eye, as illustrated by the area 85 in the center of FIG. 11. That is, when the data sample point is at this phase step 89, 3/8 of the possible input edges, those falling in area 83 in FIG. 11, will retard the sample point while 5/8 of the possible input edges, those falling in areas 85 and 87 of FIG. 11, will advance the sample point. The edges that fall in area 83 exactly cancel the effect of the edges that fall in area 87 since 3/8 of all data edges fall in each area. Thus the net result is that only the 1/4 of the edges that fall in area 85 act to adjust the clock sample point in the right direction.

Given a maximum allowable Δf between the input signal and the reference clock (bclk) of the clock recovery circuit, the maximum phase lag can be calculated. Alternatively, we can work from a budgeted phase lag and calculate the maximum Δf consistent with this amount of lag.

The formulae are:

$$\phi = \frac{JNP\Delta f}{d}$$

$$\Delta f = \frac{d\phi}{JNP}$$

where φ is phase lag in UI, J is the amount of uniform jitter in UI (peak-to-peak), N and P are the counter moduli, d is the minimum edge density (edges per UI) of the input signal, and Δf is the frequency difference (actually, given as a ratio in ppm). For example, if the input data is random, the edge density will average d=½. However to be conservative it is better to assume a lower edge density such as d=¼.

For example, with N=4, a phase lag of 0.1 UI yields a maximum Δf of 391 ppm. Increasing N to 64 while holding φ at 0.1 UI gives a maximum Δf of 24 ppm (1/16 the amount).

Second-Order Digital Clock Recovery Circuit

Figure 12:
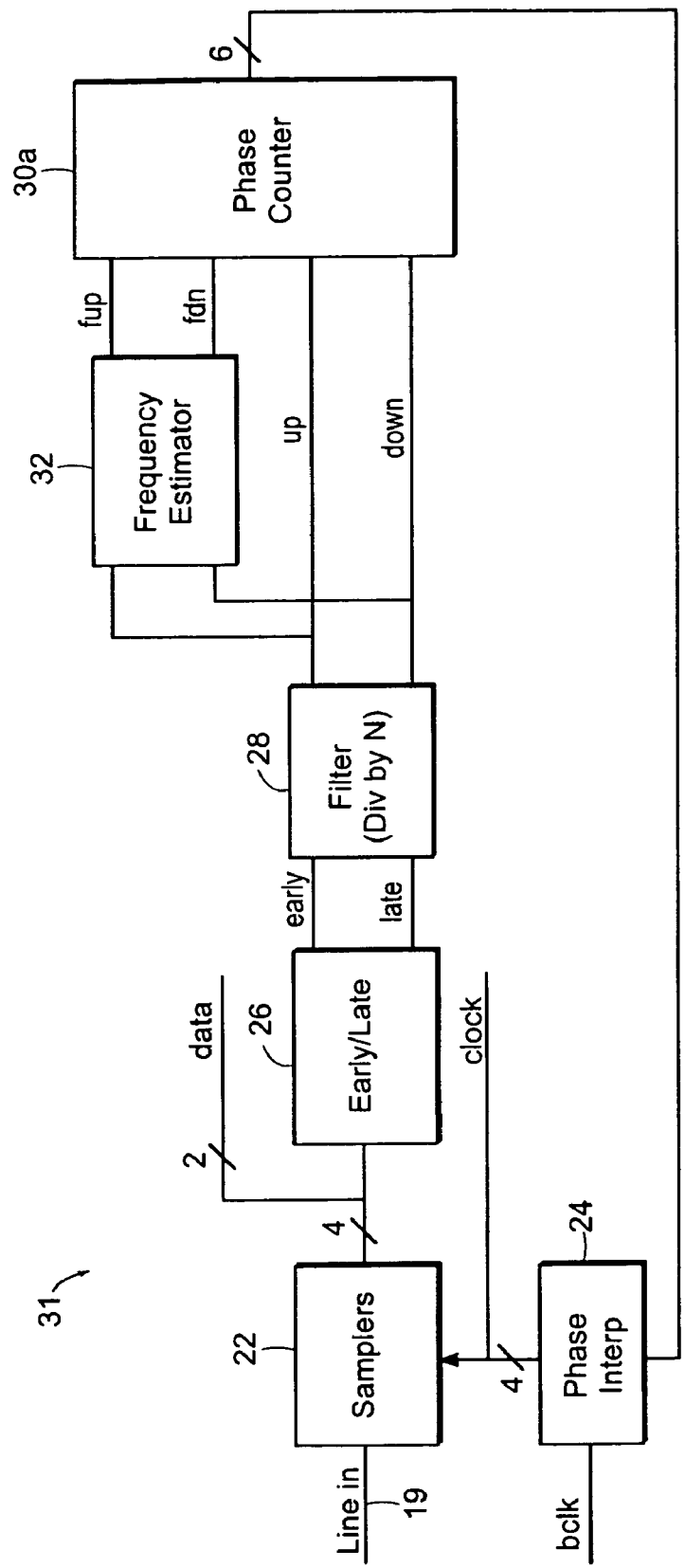
FIG. 12 is a schematic diagram of an embodiment of a dual-loop clock/data recovery (CDR) circuit of the present invention.

FIG. 12 is a schematic diagram of a dual-loop CDR circuit 31 embodiment of the present invention. The circuit 31 is similar to that shown in FIG. 4 except for the addition of a frequency estimator block 32 and the corresponding second set of up/down inputs to the phase counter 30A (a phase controller). The differential input line 19 is over-sampled by a factor of two by a set of four samplers 22 clocked by a four-phase clock from a phase interpolator 24.

As with the system of FIG. 4, for each bclk cycle, the samplers acquire four equally spaced values from the line, i.e. two data samples and two edge samples. The data and edge samples are used by the early/late block 26 to generate early and late indications. An "early" indication is generated if the edge is sampled early (differs from the next data bit) while a "late" indication is generated if the edge is sampled late (differs from the previous data bit).

The early and late indications are filtered by a divide-by-N counter 28. An "early" indication causes the counter to count up, retarding the sample point. A "late" indication causes the counter to count down, advancing the sample point. Ideally, to prevent excessive phase wander, N should be at least 64. When the counter 28 overflows upward it generates a pulse on its 'up' output. When it overflows downward, it generates a pulse on its 'down' output.

These up and down pulses drive the phase counter 30A which adjusts the position of the sampling clock via the phase interpolator 24. In addition, these up and down pulses are input into a frequency estimator 32 which estimates the frequency difference Δf between the input signal and the system clock bclk. The frequency estimator 32 generates its own up and down pulses ($f_{up}$ and $f_{dn}$) to rotate the phase counter at a steady rate corresponding to the estimated frequency difference. The phase counter rotates in the sense that each complete cycle of the counter from count 0 to count 2P−1 and back to 0 corresponds to a phase shift of 360 degrees in the phase interpolator.

Frequency Estimator

Figure 13:
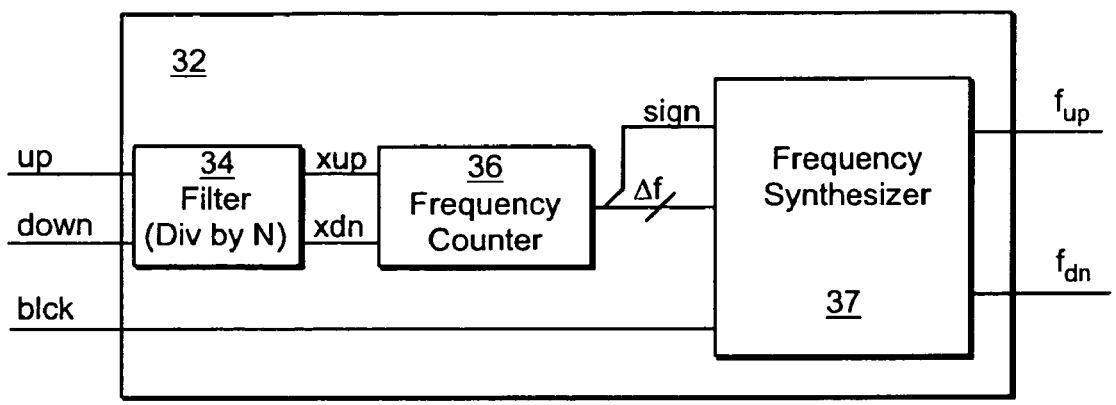
FIG. 13 is a schematic diagram of an embodiment of the frequency estimator of FIG. 12.

FIG. 13 is a schematic diagram of an embodiment of the frequency estimator 32 of FIG. 12. The up and down pulses from the divide by N counter 28 (FIG. 12) are further filtered by a divide by M counter 34 that acts to stabilize the frequency loop, the output of which is then input to a saturating frequency counter 36. The output of the frequency counter 36 represents the estimated difference in frequency, Δf, between the data signal input clock and the recovery circuit reference clock.

In one embodiment, the output of the frequency estimator 32 is in sign-magnitude format. For example, a six-bit Δf contains a sign bit, s, and a five-bit magnitude, m, which together represent the number $-1^s \times m$, covering the range from −31 to 31. One skilled in the art of timing circuit design will understand that the frequency estimator can be realized with more or fewer bits and with a different encoding (e.g., one's complement, two's complement, or one-hot) than sign magnitude.

Each increment of the frequency counter 36 output represents a uniform difference in frequency, e.g. 10 ppm, which exactly corresponds to the frequency of the correction signal that is generated by the frequency synthesizer 37, e.g. 10 ppm of 1.25 GHz is 125 KHz.

The frequency synthesizer 37 generates a pulse stream with the appropriate rate on the appropriate output. For example, if the output of the frequency counter indicates that the input signal is 20 ppm faster than the 1.25 GHz reference clock, then the frequency synthesizer generates a 250 KHz*2P=16 MHz pulse stream on the $f_{up}$ output to increase the frequency of the sample clock by 250 KHz. Similarly, if the frequency counter indicates that the input signal is 30 ppm slower than the 1.25 GHz reference clock, then the frequency synthesizer generates a 375 KHz*2P=24 MHz pulse stream on the $f_{dn}$ output to decrease the frequency of the sample clock by 375 KHz.

Figure 14:
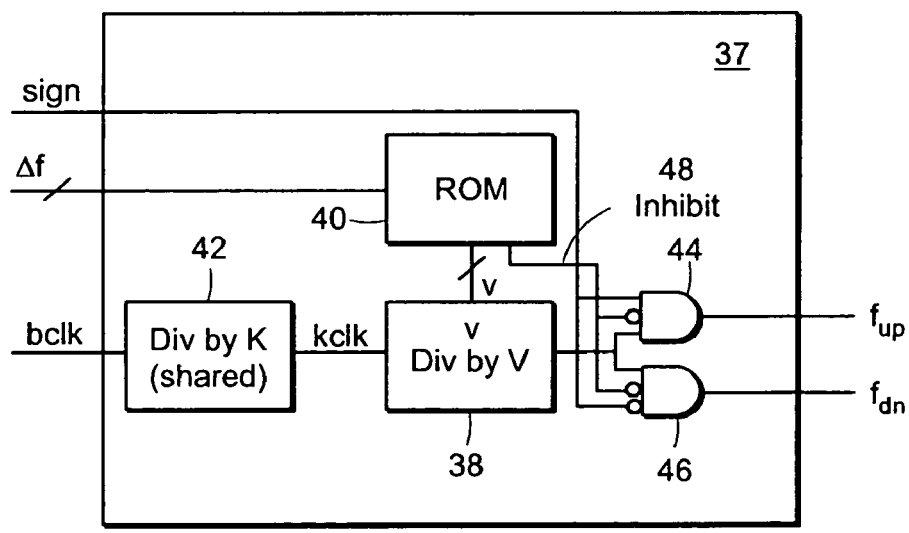
FIG. 14 is a schematic diagram of an embodiment of the frequency synthesizer of FIG. 13.

FIG. 14 is a schematic diagram of an embodiment of the frequency synthesizer 37 that uses a ROM 40 and a divide-by-V counter 38. To control the divide-by-V counter 38, Δf is converted from a frequency to a period, taking advantage of the relation that T=1/f. This reciprocal operation may be approximated by a small ROM 40. The ROM 40 outputs a value V that sets the number of kclks (K bclks) between up or down pulses.

Every V kclks, i.e. every V×K bclks, the divide-by-V counter 38 outputs a pulse. The sign bit of Δf, together with gates 44 and 46, determines whether this is an up ($f_{up}$) or a down ($f_{dn}$) pulse. When Δf is zero, the ROM 40 asserts an inhibit signal 48 that disables both the $f_{up}$ and $f_{dn}$, outputs.

The divide-by-K counter 42 may be shared among multiple receivers and can be located elsewhere, perhaps at a receive master. It divides down the bit clock, bclk, to reduce the operating frequency and required length for the divide-by-V counter 38.

The first step in calculating the required values for K and V[Δf] (the ROM contents) is to determine the maximum Δf that can be tracked by the original loop. As described in the discussion of phase wander in the background section, the maximum Δf that can be tracked is given by:

$$\Delta f = \frac{d\phi}{JNP}$$

where d is the edge density (minimum edges per bit), φ is the maximum allowable phase lag (in UI), J is the jitter (in UI), and N and P are the divider constants of the divide-by-N counter 28 and the phase counter 30.

Assuming J=0.5 UI, d=0.25, and φ=0.1, and P=32, the maximum Δf that can be tracked is provided below in Table 1 for several values of N.

TABLE 1

| N | max Δf |
|---|---|
| 32 | 4.88 × 10⁻⁵ |
| 64 | 2.44 × 10⁻⁵ |
| 128 | 1.22 × 10⁻⁵ |

For example, if N=64 and the other parameters are as above, then the maximum Δf that can be left after frequency estimation is 24 ppm.

The smallest ROM that can be used to estimate frequency to within 24 ppm while covering a range of actual frequency differences from −200 ppm to +200 ppm requires eight entries, as illustrated in the Table 2 below. For each of the eight non-zero states of the frequency counter the table shows the target difference in frequency for this count ($\Delta f$), the interval or period in bclks that is required to achieve this frequency difference (interval), the number of kclks that most closely approximates this interval (V), and the actual frequency difference corresponding to an interval of 8×V (actual $\Delta f$), and the size of the frequency step between the previous count and the present count (step). Note that while choosing a value of K greater than unity simplifies the implementation by reducing counter lengths, such a value prevents generation of the optimal interval to achieve a given frequency difference, resulting in a small difference between the desired $\Delta f$ and the actual $\Delta f$. This difference sets a limit on how large K can be made.

TABLE 2

| Count | $\Delta f$ | interval | kclks (V) | actual $\Delta f$ | step |
|---|---|---|---|---|---|
| 1 | $2.40 \times 10^{-5}$ | 1302 | 163 | $2.40 \times 10^{-5}$ | $2.40 \times 10^{-5}$ |
| 2 | $4.80 \times 10^{-5}$ | 651 | 81 | $4.82 \times 10^{-5}$ | $2.43 \times 10^{-5}$ |
| 3 | $7.20 \times 10^{-5}$ | 434 | 54 | $7.23 \times 10^{-5}$ | $2.41 \times 10^{-5}$ |
| 4 | $9.60 \times 10^{-5}$ | 326 | 41 | $9.53 \times 10^{-5}$ | $2.29 \times 10^{-5}$ |
| 5 | $1.20 \times 10^{-4}$ | 260 | 33 | $1.18 \times 10^{-4}$ | $2.31 \times 10^{-5}$ |
| 6 | $1.44 \times 10^{-4}$ | 217 | 28 | $1.40 \times 10^{-4}$ | $2.11 \times 10^{-5}$ |
| 7 | $1.68 \times 10^{-4}$ | 186 | 24 | $1.63 \times 10^{-4}$ | $2.33 \times 10^{-5}$ |
| 8 | $1.92 \times 10^{-4}$ | 163 | 21 | $1.86 \times 10^{-4}$ | $2.33 \times 10^{-5}$ |

Table 2 shows the value of V (kclks) for each frequency counter output value (step), when K=8. With the lowest divide ratio (V=163) the divide-by-V counter 38 generates a 24 ppm pulse stream. At the highest divide ration (V=21), the counter generates a 186 ppm pulse stream (which is within 24 ppm of 200 ppm). Realizing Table 2 requires a frequency counter 36 with a saturating range of −8 to +8 and an 8-bit divide-by-V counter to realize the divide by 163.

A more conservative design uses a 15-entry ROM, as shown in Table 3 below. The nominal frequency step here is 13 ppm and the worst-case step size is 16 ppm. This design, while requiring one more bit of both the frequency counter and the divide-by-V counter and requiring seven additional ROM entries, gives considerably more margin.

TABLE 3

| Count | delta F | interval | kclks | actual df | step |
|---|---|---|---|---|---|
| 1 | $1.33 \times 10^{-5}$ | 2344 | 293 | $1.33 \times 10^{-5}$ | $1.33 \times 10^{-5}$ |
| 2 | $2.67 \times 10^{-5}$ | 1172 | 146 | $2.68 \times 10^{-5}$ | $1.34 \times 10^{-5}$ |
| 3 | $4.00 \times 10^{-5}$ | 781 | 98 | $3.99 \times 10^{-5}$ | $1.31 \times 10^{-5}$ |
| 4 | $5.33 \times 10^{-5}$ | 586 | 73 | $5.35 \times 10^{-5}$ | $1.37 \times 10^{-5}$ |
| 5 | $6.67 \times 10^{-5}$ | 469 | 59 | $6.62 \times 10^{-5}$ | $1.27 \times 10^{-5}$ |
| 6 | $8.00 \times 10^{-5}$ | 391 | 49 | $7.97 \times 10^{-5}$ | $1.35 \times 10^{-5}$ |
| 7 | $9.33 \times 10^{-5}$ | 335 | 42 | $9.30 \times 10^{-5}$ | $1.33 \times 10^{-5}$ |
| 8 | $1.07 \times 10^{-4}$ | 293 | 37 | $1.06 \times 10^{-4}$ | $1.26 \times 10^{-5}$ |
| 9 | $1.20 \times 10^{-4}$ | 260 | 33 | $1.18 \times 10^{-4}$ | $1.28 \times 10^{-5}$ |
| 10 | $1.33 \times 10^{-4}$ | 234 | 30 | $1.30 \times 10^{-4}$ | $1.18 \times 10^{-5}$ |
| 11 | $1.47 \times 10^{-4}$ | 213 | 27 | $1.45 \times 10^{-4}$ | $1.45 \times 10^{-5}$ |
| 12 | $1.60 \times 10^{-4}$ | 195 | 25 | $1.56 \times 10^{-4}$ | $1.16 \times 10^{-5}$ |
| 13 | $1.73 \times 10^{-4}$ | 180 | 23 | $1.70 \times 10^{-4}$ | $1.36 \times 10^{-5}$ |
| 14 | $1.87 \times 10^{-4}$ | 167 | 21 | $1.86 \times 10^{-4}$ | $1.62 \times 10^{-5}$ |
| 15 | $2.00 \times 10^{-4}$ | 156 | 20 | $1.95 \times 10^{-4}$ | $9.30 \times 10^{-6}$ |

In yet another embodiment, both for simplification and to provide very fine-grain frequency control, the ROM can be eliminated entirely and the 1s complement of the magnitude portion of $\Delta f$ used directly as the value of V. This requires that the magnitude portion of the frequency counter 36 have eight bits. A consequence of this approach is that it takes longer for the frequency loop to acquire, as it has to step from a divider of 255 kclks to a divider of 20 kclks one step at a time. Note that in this embodiment the output of the frequency counter is not a frequency but rather a period.

In yet another embodiment of the present invention, the ROM can be replaced with a combinational logic circuit that realizes the same function.

Values of M

The value of M determines the gain of the second-order loop. Stability is assured due to the zero provided by the direct phase update provided by the up and down pulses of the divide-by-N counter 28 directly controlling the phase counter 30. However, M should be sufficiently large that the divide-by-V counter 38 has cycled at least a few times before M is updated again. At lock, where the frequency of pulses out of the divide-by-N counter 28 is at most 24 ppm (one pulse every 40,000 bclks), no divide-by-M counter is needed since the maximum interval for cycling the divide-by-V counter is 2300 bclks. In practice however, a divide-by-8 counter here would smooth the frequency adjustment process.

A value of 4 or 8 appears to be adequate for M.

Figure 15:
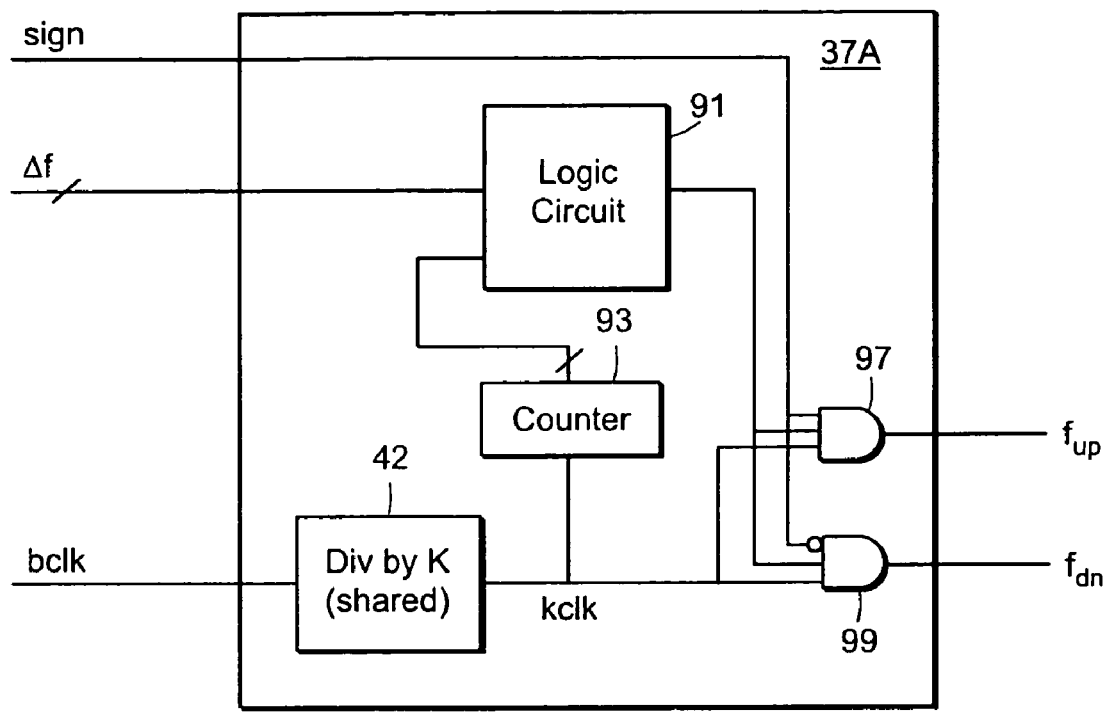
FIG. 15 is a schematic diagram of an alternate embodiment of the frequency synthesizer of FIG. 13.

FIG. 15 illustrates another embodiment of a frequency synthesizer 37A in which the output of the frequency counter is used to gate kclk pulses whenever a combinational logic circuit 91, which examines the output of a free-running counter 93 driven by kclk and the frequency counter gives a true output. Gates 97 and 99 pass the pulses to either the $f_{up}$ or the $f_{dn}$ output, depending on the value of the sign of the frequency counter output.

For example, such a circuit can generate a pulse whenever the output of the free running counter is greater than the ones complement of the frequency counter. Note that this embodiment generates the correct number of kclk pulses averaged over a long period of time. However, these pulses are not evenly spaced, leading to increased sample clock jitter.

Microcomputer Control

In one embodiment of the present invention, to facilitate debugging, both control loops should be observable and controllable from a microprocessor. Specifically, various embodiments the invention may operate in one or more of the following modes:

Fully automatic: In this mode, the phase adjust loop and frequency adjust loop both operate without any intervention from a processor.

Figure 16:
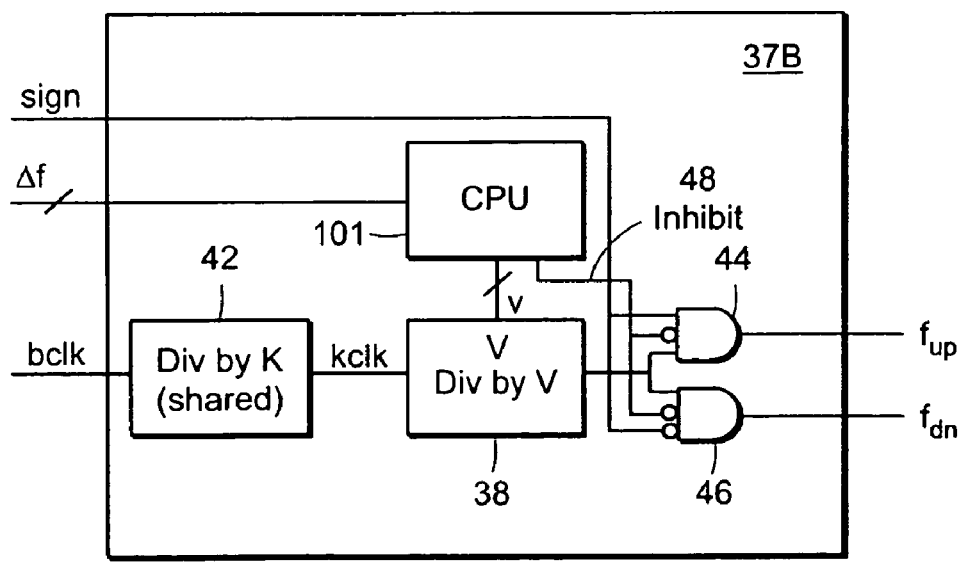
FIG. 16 is a schematic diagram of another alternate embodiment of the frequency synthesizer of FIG. 13.

Automatic phase, manual frequency: In this mode, illustrated in FIG. 16, the phase adjust loop, where the divide-by-N counter 28 (FIG. 12) directly increments and decrements the phase counter 30, operates automatically. However, the frequency adjust loop is broken by a microprocessor 101. The microprocessor 101 completes the loop by reading the output of the frequency counter ($\Delta f$) and generating the divide value (V) for the divide-by-V counter 38. In essence, the microprocessor 101 replaces the ROM 40 (FIG. 14) in this mode.

To conserve logic, in another embodiment, the saturating frequency counter may be made very small (two or three bits), while the microprocessor accumulates additional $\Delta f$ bits internally. For such a loop, the only per-receiver logic required over a first-order loop is the divide-by V counter 38 and the 2 or 3 bit saturating frequency counter 36.

Completely manual: In this mode, the microprocessor reads the saturating frequency counter and directly updates the phase setting. That is, the microprocessor also performs the function of the phase counter 6.

In any of these modes, the microprocessor should have complete observability of all counter states.

While this invention has been particularly shown and described with references to preferred embodiments thereof, it will be understood by those skilled in the art that various changes in form and details may be made therein without departing from the scope of the invention encompassed by the appended claims.

What is claimed is:

1. A clock recovery circuit, comprising:
a sampler;
logic to provide first indication indicating whether a data edge in a data signal lags or precedes a clock edge in a clock signal, the clock signal driving the sampler;
a frequency estimator which, based on the first indication, estimates a frequency difference between the data and clock to provide second indication indicating the frequency difference; and
a phase controller to receive the first and second indications and to adjust the phase of the clock signal based on the first and second indications, the phase controller continually correcting for the frequency difference.

2. The clock recovery circuit of claim 1, further comprising:
a phase interpolator which adjusts the phase of the clock responsive to the phase controller.

3. The clock recovery circuit of claim 1, further comprising a first filter coupled between the logic and the frequency estimator to filter the first indication before it is received by the frequency estimator, wherein the frequency estimator comprises:
a second filter to further filter the first indication;
a frequency counter which, responsive to the further filtered first indication, produces an output that represents an estimated difference in frequency between the clock and the data; and
a frequency synthesizer which produces the second indication responsive to the estimated frequency difference.

4. The clock recovery circuit of claim 3, wherein the frequency synthesizer comprises:
a divide-by-X counter which divides the clock by a number X which is based on the estimated frequency difference, the divided clock providing the second indication to the phase controller.

5. The clock recovery circuit of claim 4, flitter comprising:
a converter to convert the estimated frequency difference to a corresponding period, the number X being responsive to the period.

6. The clock recovery circuit of claim 5, wherein the divide-by-X counter comprises:
a divide-by-K counter, where K is a fixed number; and
a divide-by-V counter, where V is responsive to the period.

7. The clock recovery circuit of claim 6, wherein the divide-by-K counter is common to plural clock recovery circuits.

8. The clock recovery circuit of claim 5, wherein the convener comprises a read-only-memory (ROM) containing a conversion table.

9. The clock recovery circuit of claim 5, wherein the converter performs a 1's complement of a magnitude portion of the estimated frequency difference.

10. The clock recovery circuit of claim 5, wherein the convener is implemented with a microprocessor.

11. The clock recovery circuit of claim 10, wherein at least a portion of the divide-by-X counter is implemented with a microprocessor.

12. The clock recovery circuit of claim 4, wherein the frequency counter is a saturating counter.

13. The clock recovery circuit of claim 1, wherein the phase controller includes a phase counter, wherein the phase counter is to rotate according to the first indication and further rotates at a steady state corresponding to the phase difference indicated by the second indication.

14. The clock recovery circuit of claim 1, wherein the phase controller includes at least one first input to receive the first indication and at least one second input to receive the second indication.

15. The clock recovery circuit of claim 1, further comprising a filter coupled between the logic and the phase controller to fitter the first indication before it is received by the phase controller.

16. A clock recovery method, comprising:
sampling, responsive to a clock edge in a clock, a data signal;
generating first indication indicating whether a data edge lags or leads the clock edge;
based on the first indication, producing second indication indicating a frequency difference between the data and the clock;
receiving the first and second indications; and
adjusting the phase of the clock based on the first and second indications.

17. The method of claim 16, wherein the producing comprises:
dividing the clock by a number X which is based on the estimated frequency difference, the further adjustment to die phase being responsive to the divided clock.

18. The method of claim 17, further comprising:
converting the estimated frequency difference to a corresponding period, the number X being responsive to the period.

19. The method of claim 18, dividing the clock by X comprises:
dividing the clock by a number K, where K is a fixed number; and
dividing the clock by a number V, where V is responsive to the period.

20. The method of claim 19, wherein the divide-by-K counter is common to plural clock recovery circuits.

21. The method of claim 18, wherein the step of convening is performed using a stored conversion table to convert.

22. The method of claim 18, wherein the step of convening is performed using a 1's complement of a magnitude portion of the estimated frequency difference.

23. The method of claim 18, wherein the step of converting is performed by a microprocessor.

24. The method of claim 23, wherein at least a portion of the step of dividing by X is performed a microprocessor.

25. The method of claim 17, wherein the step of producing a signal is performed with a saturating counter.

26. A clock recovery system, comprising:
sampling means for sampling, responsive to a clock edge in a clock signal, a data signal;
logic means for providing first indication indicating whether a data edge lags or leads the clock edge;
frequency estimator means for estimating, based on the first indication, a frequency difference between the data and the clock, and for producing second indication indicating the frequency difference; the phase controller means further adjusting the phase of the clock based on the estimated frequency difference; and
phase controller means for receiving the first and second indications and for adjusting the phase of the clock signal based on the first and second indications.

* * * * *

UNITED STATES PATENT AND TRADEMARK OFFICE
CERTIFICATE OF CORRECTION

PATENT NO. : 7,257,183 B2 Page 1 of 1
APPLICATION NO. : 10/178902
DATED : August 14, 2007
INVENTOR(S) : William J. Dally, John H. Edmondson and Ramin Farjad-Rad It is certified that error appears in the above-identified patent and that said Letters Patent is hereby corrected as shown below:

Column 11
In Claim 5, line 41 please delete "flitter" and replace it with -- further --.

Column 11
In Claim 8, line 54 please delete "convener" and replace it with -- converter --.

Column 12
In Claim 15, line 10 please delete "fitter" and replace it with -- filter --.

Column 12
In Claim 17, line 27 please delete "die" and replace it with -- the --.

Column 12
In Claim 21, line 40 please delete "convening" and replace it with -- converting --.

Column 12
In Claim 22, line 42 please delete "convening" and replace it with -- converting --.

Signed and Sealed this

Twentieth Day of November, 2007

JON W. DUDAS
*Director of the United States Patent and Trademark Office*